(12) United States Patent
Thompson (10) Patent No.: US 7,895,006 B2
(45) Date of Patent: Feb. 22, 2011

(54) SYSTEM AND METHOD FOR DETERMINING SIGNAL-TO-NOISE RATIO (SNR), SIGNAL-TO-NOISE AND DISTORTION RATIO (SINAD) AND TOTAL HARMONIC DISTORTION (THD)

(75) Inventor: Bryan David Thompson, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 431 days.

(21) Appl. No.: 11/962,665

(22) Filed: Dec. 21, 2007

(65) Prior Publication Data
US 2009/0164159 A1 Jun. 25, 2009

(51) Int. Cl.
*G01R 29/26* (2006.01)
(52) U.S. Cl. ...................................................... 702/69
(58) Field of Classification Search .................. 702/66, 702/69, 75, 189; 324/620, 622, 623
See application file for complete search history.

(56) References Cited

U.S. PATENT DOCUMENTS

| | | | |
|---|---|---|---|
| 5,861,826 A * | 1/1999 | Shu et al. | 341/120 |
| 6,281,819 B1 * | 8/2001 | Wu et al. | 341/120 |
| 2002/0019710 A1 * | 2/2002 | Henry et al. | 702/45 |
| 2005/0032472 A1 * | 2/2005 | Jiang et al. | 455/13.4 |
| 2006/0290548 A1 * | 12/2006 | Goyal et al. | 341/120 |
| 2007/0216555 A1 * | 9/2007 | Dworski et al. | 341/120 |

OTHER PUBLICATIONS

IEEE Standard for Digitizing Waveform Recorders; IEEE Standard 1057-1994, IEEE, Dec. 1994.
John P. Deyst et al.; Bounds on Least-Squares Four-Parameter Sine-Fit Errors Due to Harmonic Distortion and Noise; IEEE Transactions on Instrumentation and Measurement; vol. 44, Issue 3, Jun. 1995; pp. 637-642.
Stenbakken et al.; Time-Base Nonlinearity Determination Using Iterated Sine-Fit Analysis; IEEE Instrumentation and Measurement Technology Conference; vol. 2; May 1988; pp. 1335-1340.
Harris; On the use of Windows for Harmonic Analysis with the Discrete Fourier Transform; Proceedings of the IEEE; vol. 66, Issue 1, Jan. 1978; pp. 51-83.
Wang at al.; Least-Squares Estimation of Time-Base Distortion of Sampling Oscilloscopes; IEEE Transactions on Instrumentation and Measurement; vol. 48, Issue 6, Dec. 1999; pp. 1324-1332.
Hsieh et al.; THD and SNR Tests Using the Simplified Volterra Series With Adaptive Algorithms; International Test Conference Proceedings; Oct. 1995; pp. 364-369.
Pintelon et al.; An Inproved Sine-Wave Fitting Procedure for Characterizing Data Acquisition Channels; IEEE Transactions on Instrumentation and Measurement; vol. 45, Issue 2, Apr. 1996; pp. 588-593.
Blair et al.; Sine-fitting Software for IEEE Standards 1057 and 1241; IEEE 1999; pp. 1504-1506.

* cited by examiner

*Primary Examiner*—Michael P Nghiem (57) ABSTRACT

A system for determining signal-to-noise ratio (SNR), signal-to-noise and distortion ratio (SINAD), and total harmonic distortion (THD), includes logic for estimating a frequency of a dominant sinusoidal signal present in a sampled data record, logic for iteratively fitting a curve, the curve including a fundamental sinusoid, harmonic components and a DC offset, and logic for computing SNR, SINAD and THD using the fundamental sinusoid, harmonic components and a DC offset.

21 Claims, 10 Drawing Sheets

Frequency domain plot of X[f] = DFT(x[n]) with the Rectangular window (no windowing).

FIG. 9

Frequency domain plot of X[f] = DFT(x[n]) with the Hanning window.

FIG. 10

Frequency domain plot of X[f] = DFT(x[n]) with the Blackmanharris window.

SYSTEM AND METHOD FOR DETERMINING SIGNAL-TO-NOISE RATIO (SNR), SIGNAL-TO-NOISE AND DISTORTION RATIO (SINAD) AND TOTAL HARMONIC DISTORTION (THD)

BACKGROUND

In many signal processing applications, it is desirable to have the ability to compute the signal-to-noise ratio (SNR), signal to noise and distortion ratio (SINAD), and total harmonic distortion (THD) of a discrete-time signal. In particular applications, it is desirable to compute these parameters for a signal having one dominant frequency component among possible DC, harmonic frequency components, and noise components.

An existing technique for computing the SNR of a discrete-time signal uses what is referred to as a "4-parameter sine-wave curve-fitting" application to analyze a discrete-time signal. Using the 4-parameter sine-wave curve-fitting application, the four unknowns are the (1) DC component, (2) fundamental frequency, (3) amplitude, and (4) phase of the dominant sinusoidal component. If the frequency of the dominant sinusoidal component is known, as it often is in practice, then the technique is reduced to a "3-parameter sine-wave curve-fitting" application. Nevertheless, a sine-wave curve-fitting algorithm that does not consider possible harmonics in the data record treats such harmonics as noise, thus making an accurate SNR measurement difficult to achieve.

Another existing technique for computing SNR, SINAD, and THD transforms the time domain data record into the frequency domain via a Discrete Fourier Transform (DFT). However, transforming the time domain data record into the frequency domain via a DFT requires that the system meet new requirements introduced by the transformation. Associated with this transformation is the requirement that the signal be coherently sampled (i.e. synchronously sampled, bin-centered, periodic within the window) so as to reduce spectral leakage. That is, the DFT assumes a periodic discrete-time data record as input. Such a strict requirement is nearly impossible to implement in practice and is certainly not possible for all applications. Thus, a common work-around, known as "windowing," is used to minimize the effects of spectral leakage. The errors due to spectral leakage are well-known to those skilled in the art, and include energy spreading across frequencies, leading to amplitude inaccuracies. These resulting errors are greatly minimized with the use of windowing. However, these errors are unavoidable, as windowing merely "patches" over the spectral leakage, and does not allow for accurate measurements to be obtained. Therefore, the result of any method that attempts to compute SNR, SINAD, and/or THD measurements of a discrete-time signal that uses a DFT to compute amplitudes of frequency components includes these inaccuracies.

Therefore, it is desirable to have a method for accurately computing the fundamental and harmonic components present in a data record that overcomes the above-mentioned drawbacks. The fundamental and harmonic components are then used for calculating SNR, SINAD, and THD.

SUMMARY

In accordance with an embodiment, a system for determining signal-to-noise ratio (SNR), signal-to-noise and distortion ratio (SINAD), and total harmonic distortion (THD), includes logic for estimating a frequency of a dominant sinusoidal signal present in a sampled data record, logic for iteratively fitting a curve, the curve comprising a fundamental sinusoid, harmonic components and a DC offset, and logic for computing SNR, SINAD and THD using the fundamental sinusoid, harmonic components and a DC offset.

Other embodiments and methods of the invention will be discussed with reference to the figures and to the detailed description.

BRIEF DESCRIPTION OF THE FIGURES

The invention will be described by way of example, in the description of exemplary embodiments, with particular reference to the accompanying figures.

DETAILED DESCRIPTION

In an embodiment, the system and method for determining signal-to-noise ratio (SNR), signal-to-noise and distortion ratio (SINAD) and total harmonic distortion (THD) describes a practical, theoretically-sound, and accurate method for determining the SNR, SINAD, and THD of a discrete-time signal having at least one dominant frequency component and possibly having one or more less dominant frequency components.

While described below for use in a general purpose computer, the system and method for determining SNR, SINAD and THD can be implemented in any computing device, integrated circuit (IC) element, application specific integrated circuit (ASIC), field programmable gate array (FPGA) or any other processor or computing circuit.

While generally implemented in software, the system and method for determining SNR, SINAD and THD can be implemented in hardware, software, or a combination of hardware and software. If implemented in hardware, the system and method for determining SNR, SINAD and THD can be implemented using specialized hardware elements and logic. When the system and method for determining SNR, SINAD and THD is implemented in hardware or software, the logic can be used to control various components so that various operating aspects can be software-controlled. The software can be stored in a memory and executed by a suitable instruction execution system (e.g., a microprocessor). A hardware implementation of the system and method for determining SNR, SINAD and THD can include any or a combination of the following technologies, which are all well-known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for determining SNR, SINAD and THD comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
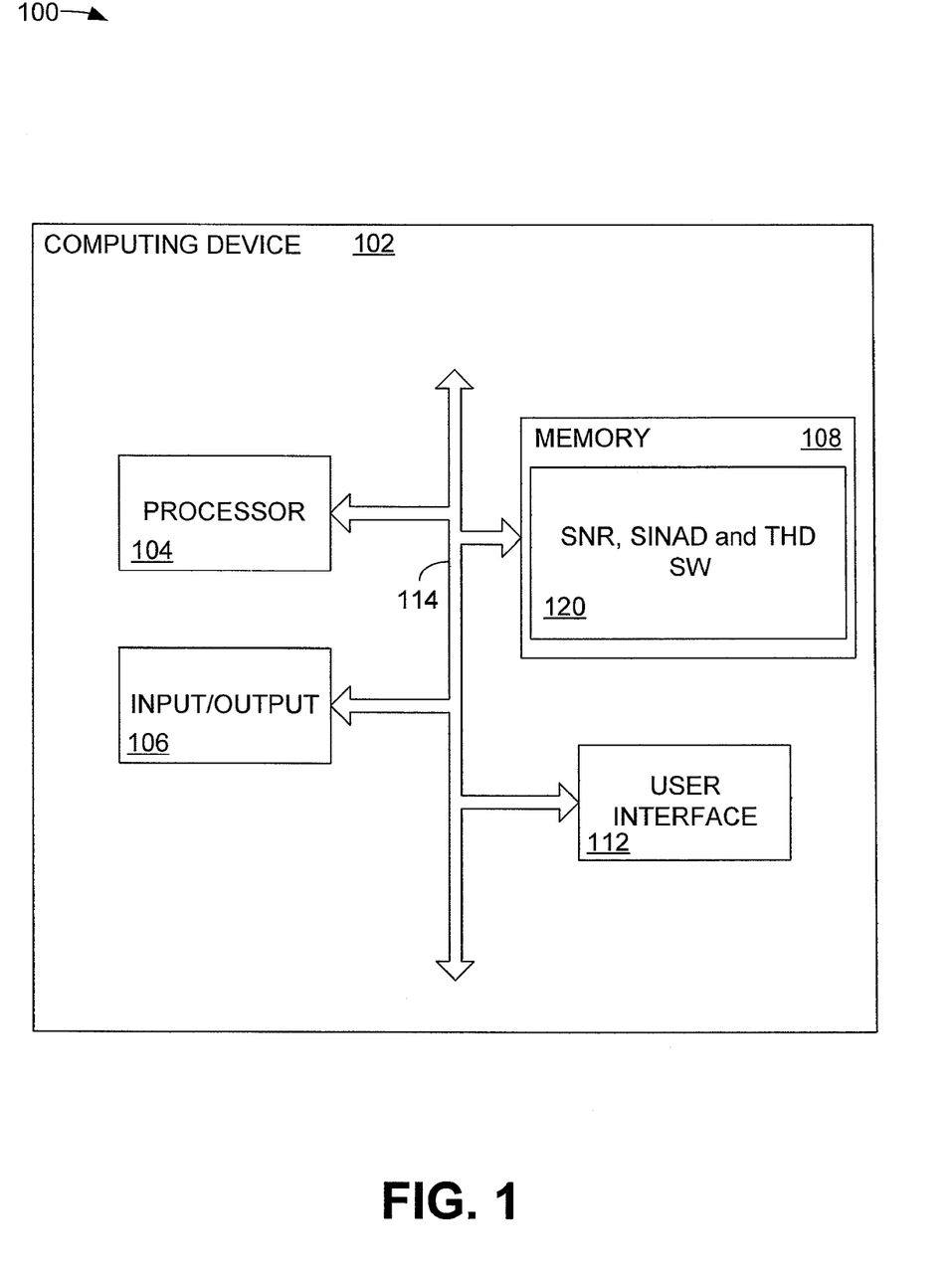
FIG. 1 is a block diagram of a general purpose computing device or any processor, which can be used to implement an embodiment of the system and method for determining SNR, SINAD and THD.

FIG. 1 is a block diagram 100 of a general purpose computing device 102 or any processor, which can be used to implement an embodiment of the system and method for determining SNR, SINAD and THD.

The computing device 102 can be any general purpose computing device or specialized computing device, and typically includes a processor 104, an input/output element 106, a memory 108, and a user interface 112 coupled together via interface 114. The interface 114 can be a physical connection, a logical connection, or a combination of physical and logical connections that enable bi-directional communication among the connected elements. In an alternative embodiment, the elements within the computing device 102 may be distributed over a number of different computing devices and logically coupled together.

The memory 108 includes a number of software elements (not shown) that enable the computing device 102 to operate. The memory 108 also includes SNR, SINAD and THD software 120. The SNR, SINAD and THD software 120 includes the logic used to compute the signal-to-noise ratio, signal-to-noise and distortion ratio and the total harmonic distortion of a discrete-time signal.

The input/output element 106 provides external connectivity for the computing device 102. The user interface 112 provides visibility and control of the SNR, SINAD and THD software 120. The user interface 112 also provides a user with a graphical user interface that allows various aspects of the SNR, SINAD and THD software 120 to be controlled. The graphical user interface also allows a user to control, adjust and tune various operating aspects of a system being analyzed.

Given a data record that comprises primarily a dominant sinusoidal signal in the presence of a DC bias, noise, and/or harmonic components, the SNR, SINAD and THD software 120 calculates the SNR, SINAD, and THD of the data record given at least two parameters. The at least two parameters include the sampling frequency, Fs, at which the data is sampled and the data record itself. An example data record is shown as:

x=−43.2566, −43.1922, −43.1283, −43.0650, −43.0022, −42.9407, −42.8806, −42.8220, −42.7653, −42.7106, −42.6582, −42.6084, −42.5610, −42.5169, −42.4757, −42.4375, −42.4030, −42.3718, −42.3443, −42.3203, −42.3003, −42.2837, −42.2712, −42.2629, −42.2581, −42.2574, −42.2608, −42.2679, −42.2787, −42.2935, −42.3118, −42.3339, −42.3595, −42.3886, −42.4210, −42.4565, −42.4954, −42.5369, −42.5812, −42.6282, −42.6772, −42.7288, −42.7820, −42.8375, −42.8942, −42.9525, −43.0120, −43.0725, −43.1333, −43.1949, −43.2564, −43.3182, −43.3795, −43.4407, −43.5011, −43.5604, −43.6188, −43.6755, −43.7308, −43.7843, −43.8357, −43.8848, −43.9320, −43.9761, −44.0176, −44.0562, −44.0918, −44.1243, −44.1533, −44.1789, −44.2011, −44.2196, −44.2343, −44.2453, −44.2523, −44.2555, −44.2547, −44.2500, −44.2416, −44.2291, −44.2127, −44.1926, −44.1689, −44.1411, −44.1100, −44.0754, −44.0374, −43.9960, −43.9518, −43.9046, −43.8547, −43.8024, −43.7477, −43.6909, −43.6325, −43.5721, −43.5106, −43.4482, −43.3847, −43.3208.

In this example, 'x' is a 100 element vector, where x[1]=−43.2566, x[2]=−43.1922, etc. A plot of these points is shown as the first 100 points of the plot of FIG. 8.

A sine-wave curve fit algorithm, which includes harmonics, is used to minimize the least squared error of the original data with the fitted curve. The sampled data in the data record can be expressed as:

Sample_Data[$n$]=fundamental_sinusoid[$n$]+harmonics_of_fundamental_sinusoid[$n$]+noise[$n$]+DC  (Eq. 1)

The resulting sine-wave curve from the curve-fitting procedure is represented by the following:

Fitted_Curve[$n$]=fundamental_sinusoid[$n$]+harmonics_of_fundamental_sinusoid[$n$]+DC  (Eq. 2)

Figure 2:
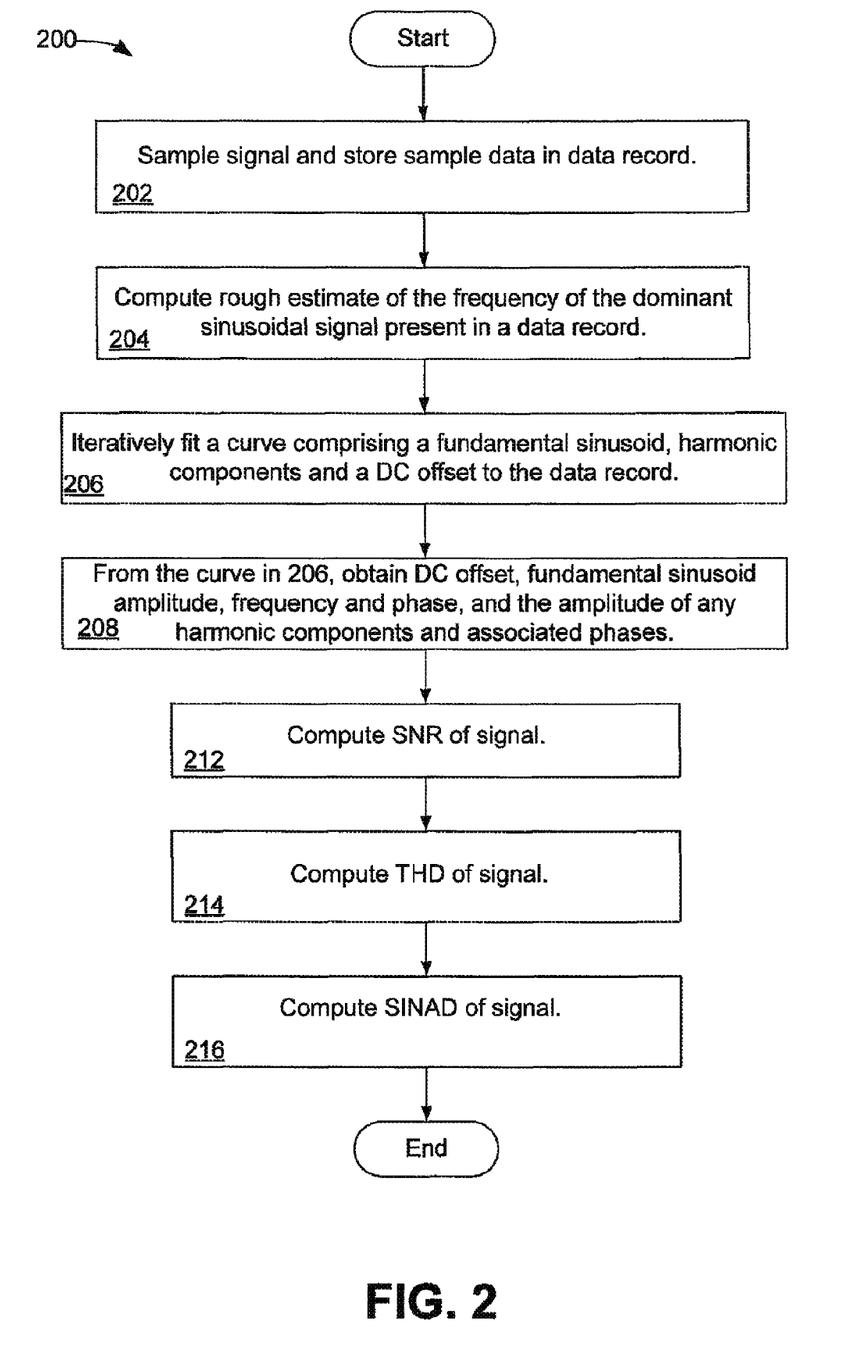
FIG. 2 is a flow chart illustrating an embodiment of the SNR, SINAD and THD software of FIG. 1.

FIG. 2 is a flow chart 200 illustrating an embodiment of the SNR, SINAD and THD software of FIG. 1.

In block 202, an analog signal is sampled and stored. In an embodiment, the analog signal is a sinusoidal signal that is digitized. In block 204, a rough estimate of the frequency of the dominant sinusoidal signal present in the data record is determined. In block 206, a curve comprising a fundamental sinusoid, harmonic components, and a DC offset to the data record is iteratively fitted. In block 208, and using the curve developed in block 206, the DC offset, the fundamental sinusoid amplitude, the frequency, and phase, and the amplitudes of the harmonic components and associated phases are obtained. Using the rough estimate of the frequency of the fundamental sinusoid computed in block 204, the SNR is determined in block 212, the THD is determined in block 214 and the SINAD is determined in block 216.

Figure 3:
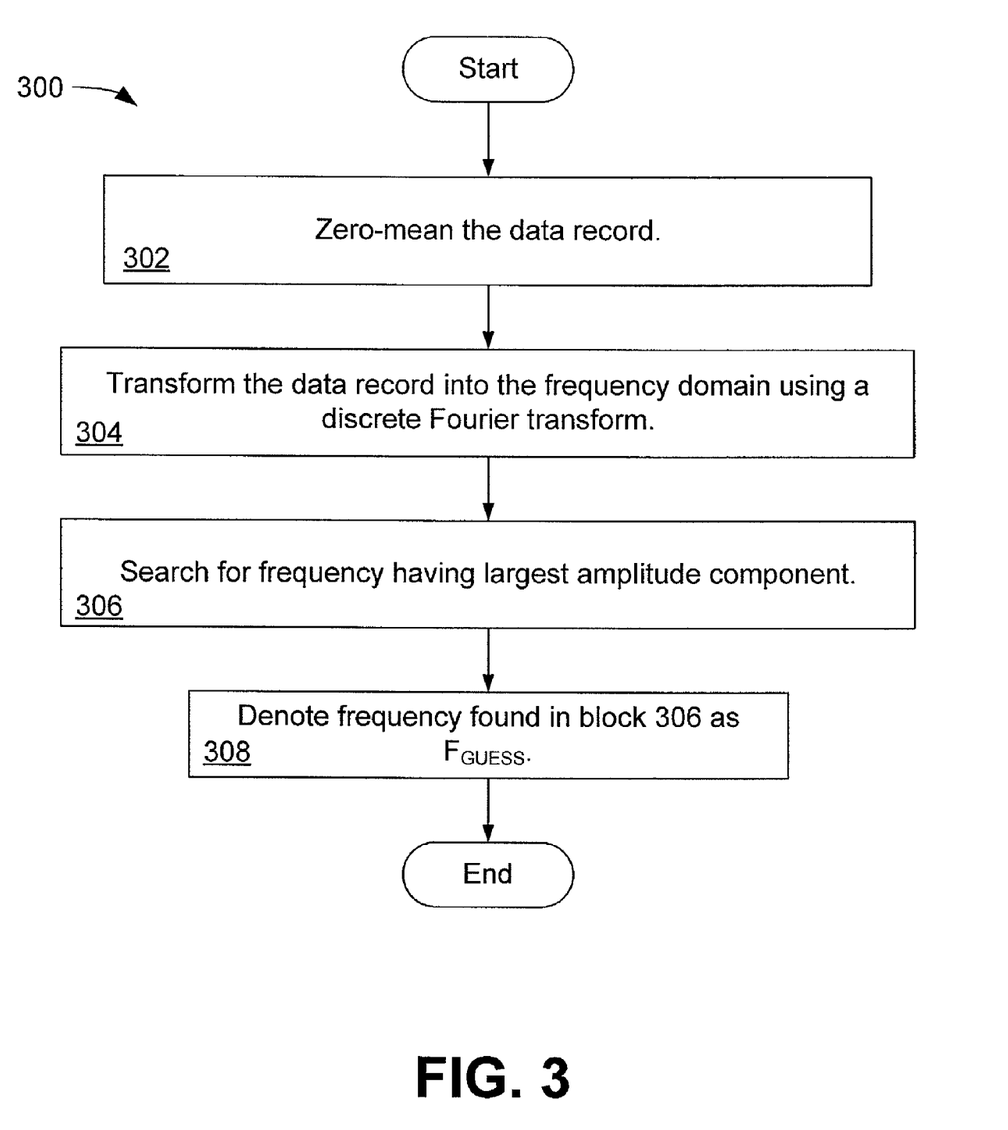
FIG. 3 is a flow chart illustrating an embodiment of the computation of the estimate of the frequency of the dominant sinusoidal signal present in the data record of FIG. 2.

FIG. 3 is a flow chart 300 illustrating an embodiment of the computation of the estimate of the frequency of the dominant sinusoidal signal present in the data record in block 204 of FIG. 2.

In block 302, the data record is processed so as to zero-mean the data record. To zero-mean the data record, the mean must be known. Once the mean of the data record is known, then subtracting the mean from the data record can be accomplished without any loss of generality. In block 304, the data record is transformed into the frequency domain using a discrete Fourier transform. In block 306, the frequency with the largest magnitude amplitude component is searched and discovered. In block 308, the frequency discovered in block 306 is denoted as $F_{GUESS}$.

Figure 4A:
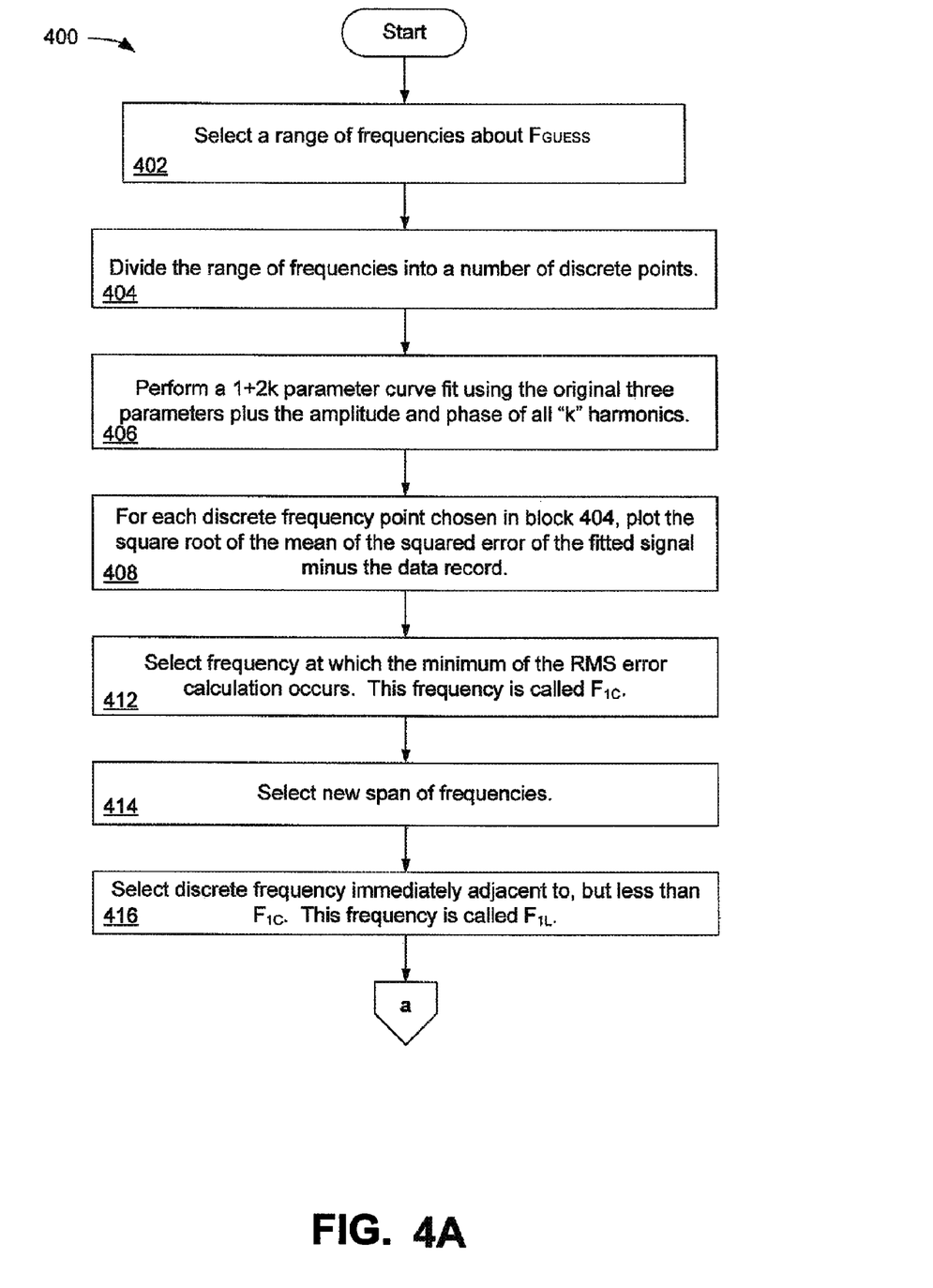
FIGS. 4A and 4B are a flow chart illustrating an embodiment of the iterative curve fitting process described in FIG. 2.
Figure 4B:
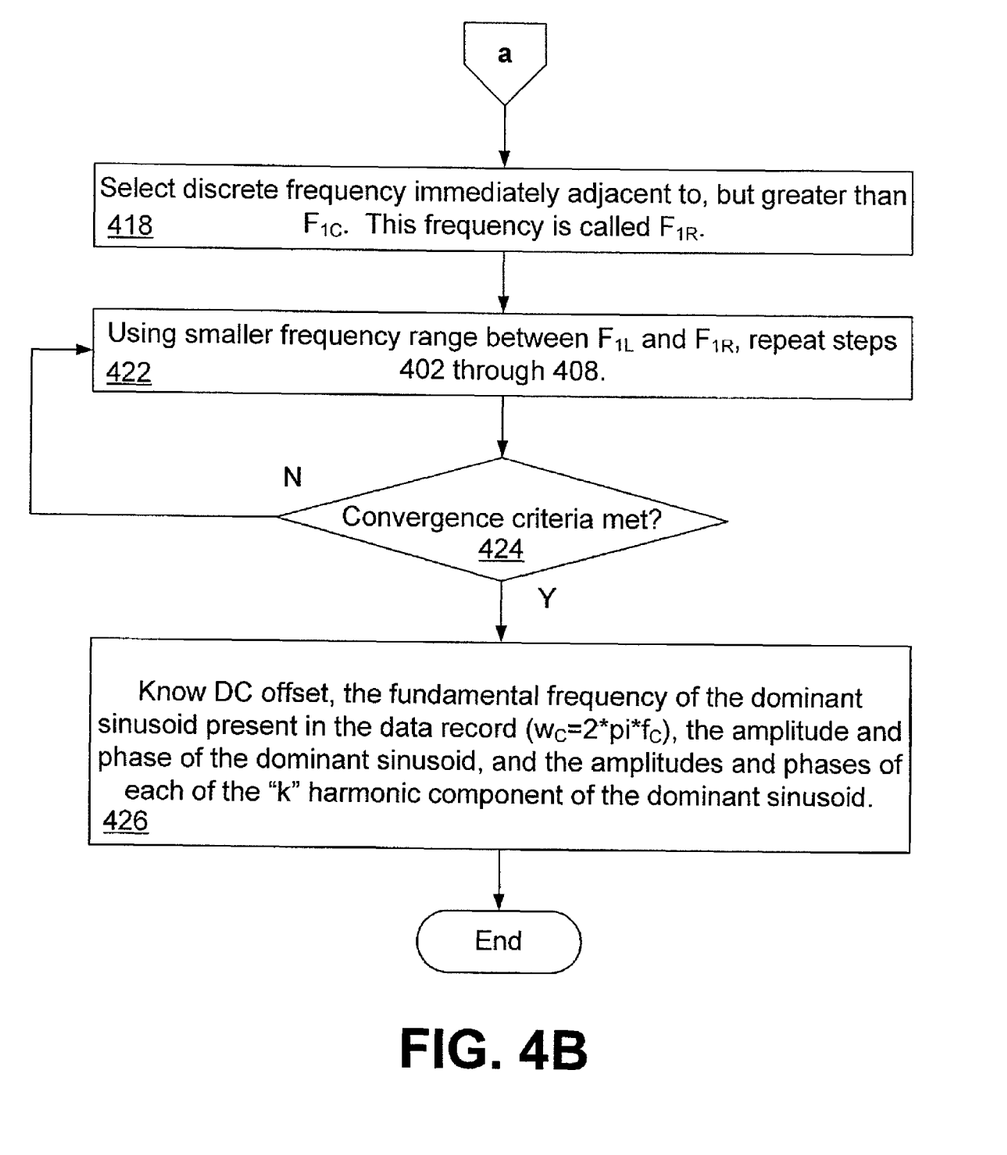

FIGS. 4A and 4B are a flow chart 400 illustrating an embodiment of the iterative curve fitting process described in block 206 of FIG. 2. In block 402, a range of frequencies is selected. In an embodiment, the range of frequencies can be, for example, 80% of $F_{GUESS}$ to 120% of $F_{GUESS}$. In block 404, the range of frequencies is divided into a number of discrete points. In an embodiment, the range of frequencies can be divided into about 100 discrete points. However, other values are possible.

In block 406, a 1+2k-parameter least squares fit to the data is performed also using the amplitude and phase of all "k" harmonics. The 1+2k-parameters include a DC component, phase and amplitude of the fundamental frequency and "k−1" harmonics, in which the frequency being used is the guess frequency $F_{GUESS}$. However, the original D matrix (shown below) is replaced with a new D matrix (shown below) that incorporates the harmonic components of the signal. The original D matrix treats harmonics of the fundamental frequency as noise, and therefore, assumes that there is no harmonic content. This assumption leads to errors if the original D matrix is used to determine the frequency of the sampled sinusoidal signal, and then use the possible erroneous frequency to determine the SNR, SINAD and THD. The new D matrix includes terms (such as $\cos(k\omega_0 t_{1,2M})$ and $\sin(k\omega_0 t_{1,2,M})$) that take harmonic content into account. The original D matrix and the new D matrix are illustrated below.

Original D matrix:

$$D_0 = \begin{bmatrix} \cos(\omega_0 t_1) & \sin(\omega_0 t_1) & 1 \\ \cos(\omega_0 t_2) & \sin(\omega_0 t_2) & 1 \\ \vdots & \vdots & \vdots \\ \cos(\omega_0 t_M) & \sin(\omega_0 t_M) & 1 \end{bmatrix}$$

New D matrix:

$$D_0 = \begin{bmatrix} 1 & \cos(\omega_0 t_1) & \sin(\omega_0 t_1) & \cos(2\omega_0 t_1) & \sin(2\omega_0 t_1) & \cdots & \cos(k\omega_0 t_1) & \sin(k\omega_0 t_1) \\ 1 & \cos(\omega_0 t_2) & \sin(\omega_0 t_2) & \cos(2\omega_0 t_2) & \sin(2\omega_0 t_2) & \cdots & \cos(k\omega_0 t_2) & \sin(k\omega_0 t_2) \\ \vdots & \vdots & \vdots & \vdots & \vdots & & \vdots & \vdots \\ 1 & \cos(\omega_0 t_M) & \sin(\omega_0 t_M) & \cos(2\omega_0 t_M) & \sin(2\omega_0 t_M) & \cdots & \cos(k\omega_0 t_M) & \sin(k\omega_0 t_M) \end{bmatrix}$$

In this example, $t_n$ is the $n^{th}$ element, where "n" is an integer from 1 to "M". In this example, $t_n$ refers to the time vector which is generated in steps from 0 to (length of data record−1)/Fs by 1/Fs. That is, t=[0, 1/Fs, 2/Fs, ..., (M−1)/Fs], where M is the length of the data record. In this example, $t_1$=0, and $t_2$=1/Fs. Also, k is the desired number of harmonics to identify, including the fundamental. Theoretically, values of k approaching infinity can be used. The larger the value of k the more accurate is the computation, since no harmonic components should be treated as noise. However, for most applications, only the first few harmonics (in an embodiment, less than, for example, 10) have significant impact. Also note that the larger k gets, the computations become more intensive. Therefore, for practical purposes, and in a particular embodiment, k can be set to 10.

Thus, instead of being a 3-parameter curve fit (amplitude of sinusoid, phase, and DC offset) the new D matrix describes a "1+2k" parameter" curve fit (the amplitude and phase of the fundamental, or first harmonic, plus any DC component, plus phase and amplitude for the remaining "k−1" harmonics).

Figure 5:
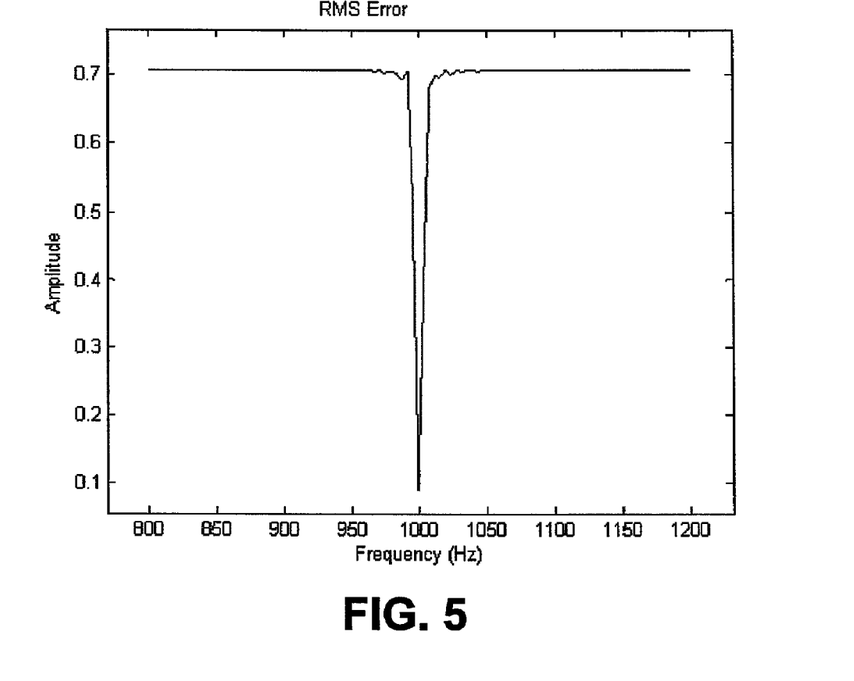
FIG. 5 is a 100 point plot of RMS error versus the guessed frequency of the fitted curve.

In block 408, for each of the discrete frequency points chosen in block 404 (e.g., each of the 100 points in this example), the system plots the square-root of the mean of the squared error of the fitted signal minus the data record (root mean square (RMS) error of fitted—actual). Thus, for this example, a 100 point plot of RMS error versus the guessed frequency of the fitted curve is plotted. An example of such a plot is shown in FIG. 5.

In block 412, the frequency at which the minimum of the RMS error calculations occurs is selected. This frequency is called $F_{1C}$ (1: first iteration, C: center frequency). In block 414, a new span of frequencies is selected as follows.

In block 416, the discrete frequency immediately adjacent to $F_{1C}$ but less than $F_{1C}$ is selected. This frequency is called $F_{1L}$ (1: first iteration, L: to the left). In block 418, the discrete frequency immediately adjacent to $F_{1C}$ but greater than $F_{1C}$ is selected. This frequency is called $F_{1R}$ (1: first iteration, R: to the right).

Figure 6:
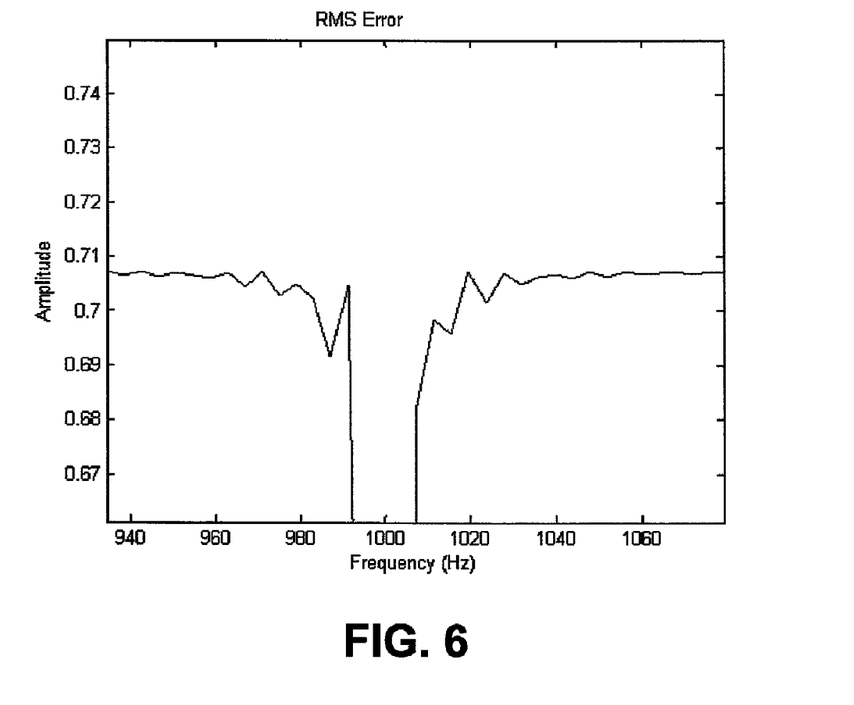
FIG. 6 illustrates that the iterative 4-parameter (including frequency estimation) prior art solution would fail if a guess frequency outside the range (990 to 1010, in this example) was chosen.

In block 422, using the smaller frequency range (between $F_{1L}$ and $F_{1R}$) repeat blocks 402 through 408. The result of the action of block 422 is shown in FIG. 6. FIG. 6 illustrates that the iterative 4-parameter (including frequency estimation) prior art solution would fail if a guess frequency outside the range (990 to 1010, in this example) was chosen. This is because the frequency iteration is performed in the direction opposite to the gradient (to minimize the error). However, this could result in convergence to a local minimum rather than the global minimum. Hence, the present invention uses a frequency searching technique for finding the global minimum of the RMS error.

FIG. 6 shows how the RMS error is, in general, not monotonically decreasing when approaching the minimum error from the left (lower guess frequencies) or right (higher guess frequencies). This shows how the frequency searching algorithm defined in prior IEEE standard 1057 will not converge unless very accurate frequency guess criterion is met. That is, the user would have to guess a frequency greater than roughly 990 Hz and less than 1010 Hz in order to converge to the true frequency of the signal at 1000 Hz. This is because the algorithm presented in IEEE standard 1057 is a gradient-based method. Also, since the prior method treats harmonics as noise, the introduction of further error sources is quite possible. The present invention allows for a much greater span of frequencies to be tested, at the expense of adding computation time and complexity, i.e. the invention allows the user to find the dominant frequency with far more relaxed requirements on prior knowledge of the signal.

In block 424 it is determined whether the convergence criteria are met.

Examples of the convergence criteria include, for example when the SNR, THD, and/or SINAD measurements stop changing by more than a specified amount, or when the frequency bins are smaller than a specified amount (e.g., when $\Delta F <$ threshold). If, in block 424 it is determined that the convergence criteria are not met, the process returns to block 422.

If, in block 424 it is determined that the convergence criteria have been met, then, in block 426, the following criterion are known: the DC offset, the fundamental frequency of the dominant sinusoid present in the data record, which is referred to as $W_C = 2*pi*f_C$, the amplitude and phase of the dominant sinusoid, and the amplitudes and phases of each of the k−1 harmonic components of the dominant sinusoid.

Once block 426 in FIG. 4B is performed, then computation of SNR, THD and SINAD is performed using an algebraic computation.

Figure 7:
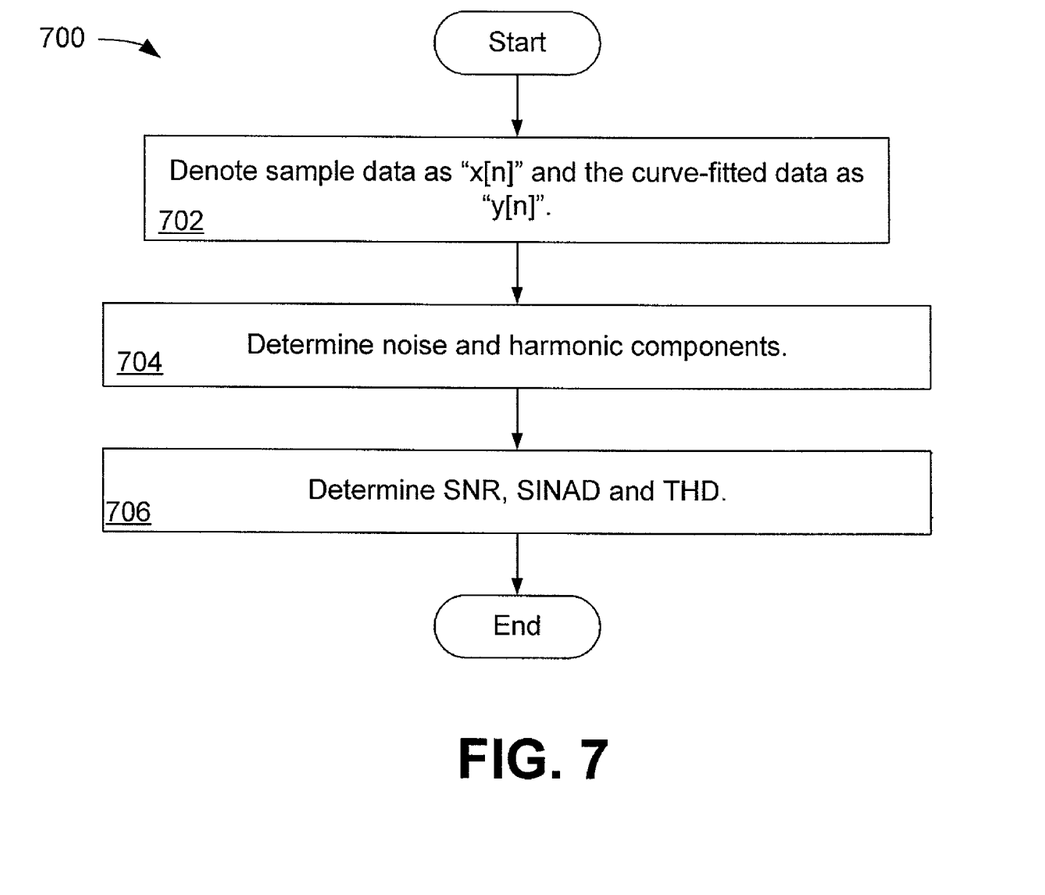
FIG. 7 is a flowchart illustrating an example of the determination of SNR, SINAD and THD.

FIG. 7 is a flowchart illustrating an example of the determination of SNR, SINAD and THD. In block 702, the sample data is denoted as "x[n]" and the fitted data is denoted as "y[n]" from the continuous time signals x(t) and y(t).

$$\begin{aligned}
x(nT) = x[n] = & DC + A_1 \sin[f\,n + \phi_1] \\
& + A_2 \sin[2\,f\,n + \phi_2] + \\
& + A_3 \sin[3\,f\,n + \phi_3] + \\
& + \ldots + \\
& + A_k \sin[k\,f\,n + \phi_k] + \\
& + \text{noise}[n]
\end{aligned} \quad \text{(Eq. 3)}$$

$$\begin{aligned}
y(nT) = y[n] = & DC_F + B_1 \sin[f_C\,n + \psi_1] \\
& + B_2 \sin[2\,f_C\,n + \psi_2] + \\
& + B_3 \sin[3\,f_C\,n + \psi_3] + \\
& + \ldots + \\
& + B_k \sin[k\,f_C\,n + \psi_k]
\end{aligned} \quad \text{(Eq. 4)}$$

In an embodiment, setting strict convergence criteria will yield the following.

$B_i \rightarrow A_i$, for i=1, 2, ..., k
$f_C \rightarrow f$
$\Psi_i \rightarrow \phi_i$, for i=1, 2, ..., k
$DC_F \rightarrow DC$ That is, the estimation parameters will approach the actual parameters. In block 704, the noise and harmonic components (excluding the first, as it is the fundamental component) are obtained as follows.

$$\begin{aligned}
\text{noise}[n] = & x[n] - y[n] \\
\text{harmonics}[n] = & B_2 \sin[2\,f_C\,n + \psi_2] + \\
& + B_3 \sin[3\,f_C\,n + \psi_3] + \\
& + \ldots + \\
& + B_k \sin[k\,f_C\,n + \psi_k]
\end{aligned} \quad \begin{matrix}\text{(Eq. 5)} \\ \\ \\ \\ \text{(Eq. 6)}\end{matrix}$$

In block 706, values for SNR, SINAD, and THD are determined using the following.

$$SNR = 20*\log_{10}(RMS(y[n])/RMS(\text{noise}[n])) \quad \text{(Eq. 7)}$$

$$SINAD = 20*\log_{10}(RMS(y[n])/RMS(\text{harmonics}[n] + \text{noise}[n])) \quad \text{(Eq. 8)}$$

$$THD = 20*\log_{10}(RSS([B_2, B_3, \ldots, B_k])/|B_1|), \quad \text{(Eq. 9)}$$

where RSS is the square-root of the sum of the squares of the elements in the vector $[B_2, B_3, \ldots, B_k]$.

The following shows an example of the system and method for determining SNR, SINAD and THD using MATLAB in which the sampled signal includes a DC offset, a fundamental, two harmonics, and added noise.

EXAMPLE 1

Create simulation data using the following segment of code. This samples the following x(t) signal at a frequency of 100 kHz and takes 65536 samples.

x(t)=sin [2 pi 1000 t]+1e−2 sin [2 pi 2000 t]+1e−3 sin [2 pi 3000 t]+−43.25+1e−4 noise[n], where, noise[n] is a Gaussian distributed random vector of mean 0 and variance 1.

```
%------------------------------------------------
% Generate the signal
%------------------------------------------------
f = 1000              % (Hz) fundamental frequency of
signal
N = 65536;            % num of samples
Fs = 100000;          % (Hz) sampling frequency
t = [0:N-1]'/Fs;      % (sec) creating the time
vector
DC = -43.25                       % DC offset
fund_amp     = 1                  % Fundamental
Amplitude
harm_amps    = [1e-2 1e-3]        % Harmonic
Amplitudes
noise_amp    = 1e-4               % Noise amplitude
fdc = fund_amp*sin(2*pi*f*t) + DC; % The
fundamental and DC term
har = zeros(length(t),1);
for i = 1:length(harm_amps) % The harmonic terms
    har = har +
harm_amps(i)*sin(2*pi*(i+1)*f*t);
end
noi = noise_amp*randn(size(t));
x = fdc+har+noi;
% Actual SNR, SINAD, and THD measurements
rms_signal = sqrt(mean((fdc).^2));
rms_nad = sqrt(mean((har+noi).^2));
rms_noise = sqrt(mean((noi).^2));
snrA = 20*log10(rms_signal/rms_noise);
sinadA = 20*log10(rms_signal/rms_nad);
thdA =
20*log10(sqrt(sum((harm_amps).^2)/fund_amp^2));
fprintf('Actual SNR     (dB) = %1.16e \n',snrA)
fprintf('Actual SINAD   (dB) = %1.16e \n',sinadA)
fprintf('Actual THD     (dB) = %1.16e \n',thdA)
%------------------------------------------------
```

Output of code segment:

```
f =
        1000
DC =
   -43.25000000000000
fund_amp =
     1
harm_amps =
   0.01000000000000   0.00100000000000
noise_amp =
  1.000000000000000e-004
Actual SNR (dB)    = 1.1272463959476511e+002
Actual SINAD (dB)  = 7.5687323161302032e+001
Actual THD (dB)    = -3.9956786262173566e+001
```

Generate time and frequency domain plots using the following segment of code.

```
%----------------------------------------------
% Plot the signal versus time. "plotXvsT" is
an m-file that is included in this document.
%----------------------------------------------
plotXvsT(t,x);
%----------------------------------------------
%----------------------------------------------
% Plot the windowed versions of the signal in
the frequency
%    domain. "bfft" is an m-file that is
%    included in this document.
%----------------------------------------------
bfft(x-mean(x),Fs,'rectwin','plots');
bfft(x-mean(x),Fs,'hanning','plots');
bfft(x-mean(x),Fs,'blackmanharris','plots');
%----------------------------------------------
```

Figure 8:
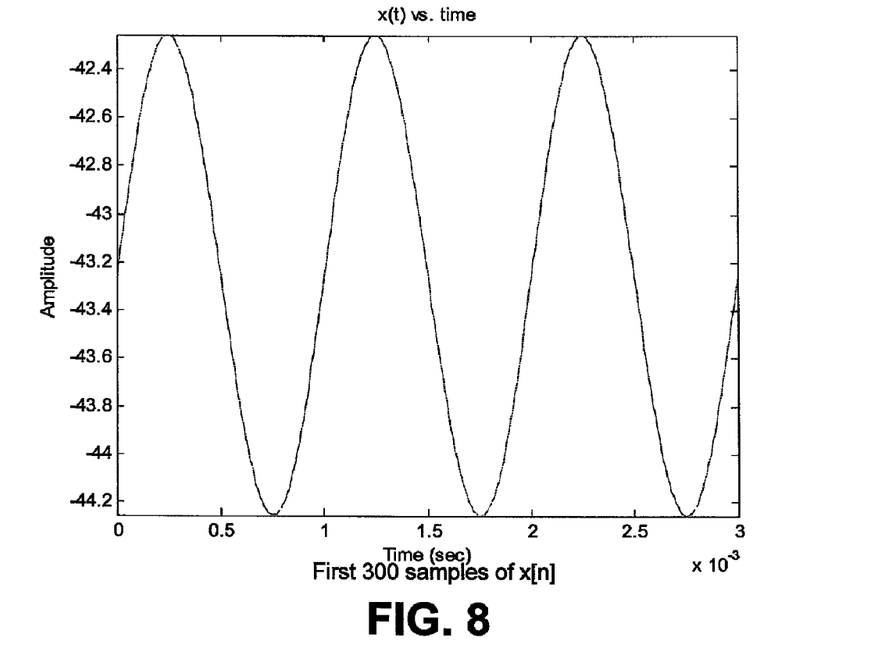
FIG. 8 shows a plot of the first 300 samples of the 65536 samples in a data record x[n].

The output of the code segment is shown in FIG. 8. FIG. 8 shows a plot of the first 300 samples of the 65536 samples in the data record x[n]. The noise and/or harmonics present in the signal are not evident from the appearance of the plot in FIG. 8. As a result, the signal in FIG. 8 appears to be a perfect sinusoid. As shown below, by transferring the data into the frequency domain, the other components present in the signal become visible.

Figure 9:
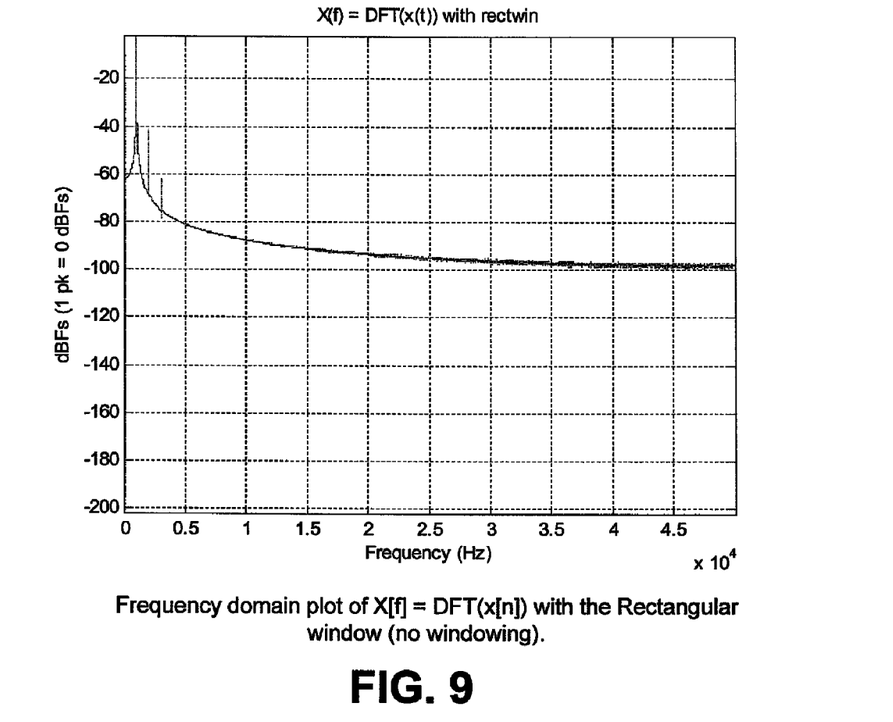
FIG. 9 is a plot of the zero-mean sample of FIG. 8 in the frequency domain, transformed via the DFT without the use of windowing.

FIG. 9 is a plot of the zero-mean sample of FIG. 8 in the frequency domain, transformed via the DFT without the use of windowing (i.e. using a rectangular window). The spectral leakage of the signal is clear. FIG. 9 shows the magnitude of the discrete Fourier transform (DFT) of the signal of FIG. 8. The DC component of the signal was removed prior to the DFT. At approximately 2 kHz, a signal of a little under −40 dB (amplitude=1e−2) is present. At approximately 3 kHz, a frequency component of a little under −60 dB (amplitude=1e−3) is present. The fundamental frequency component, at 1 kHz, should be at 0 dB (amplitude=1) but instead is somewhat less than that. Since no windowing algorithm was used, energy spreading across all the frequencies has occurred. This explains why the amplitudes of the frequency components are not less than what is expected. Next, windowing is implemented using the Hanning and Blackmanharris windows.

Figure 10:
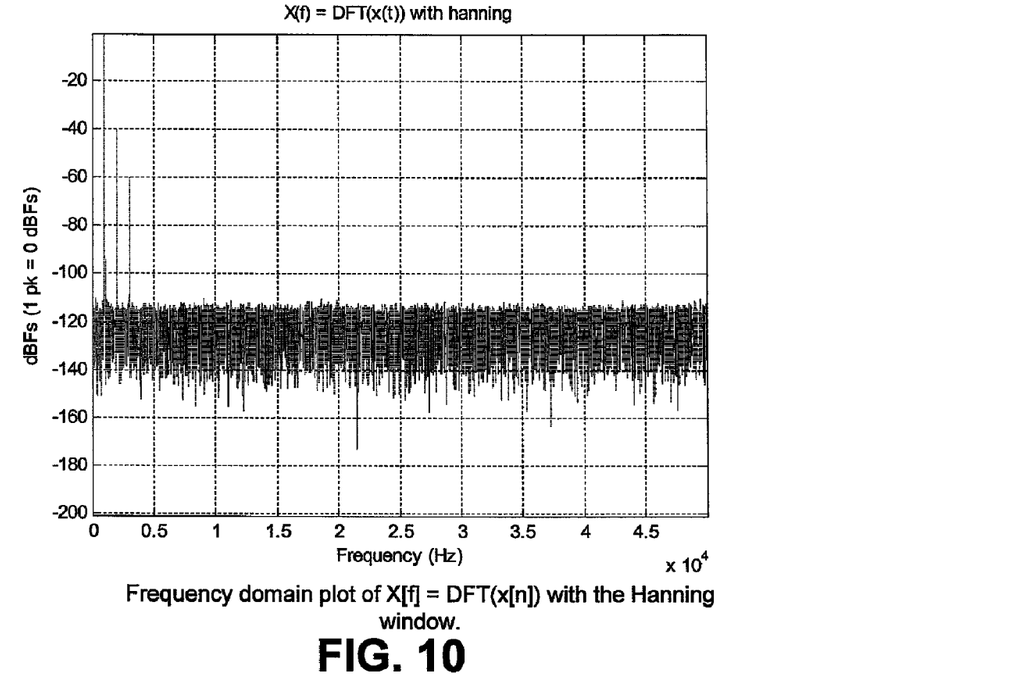
FIG. 10 is a plot of the zero-mean sample of FIG. 8 in the frequency domain, transformed via the DFT after the application of the well-known Hanning window.

FIG. 10 is a plot of the zero-mean sample of FIG. 8 in the frequency domain, transformed via the DFT after the application of the well-known Hanning window. The spectral leakage of the signal is significantly reduced.

Figure 11:
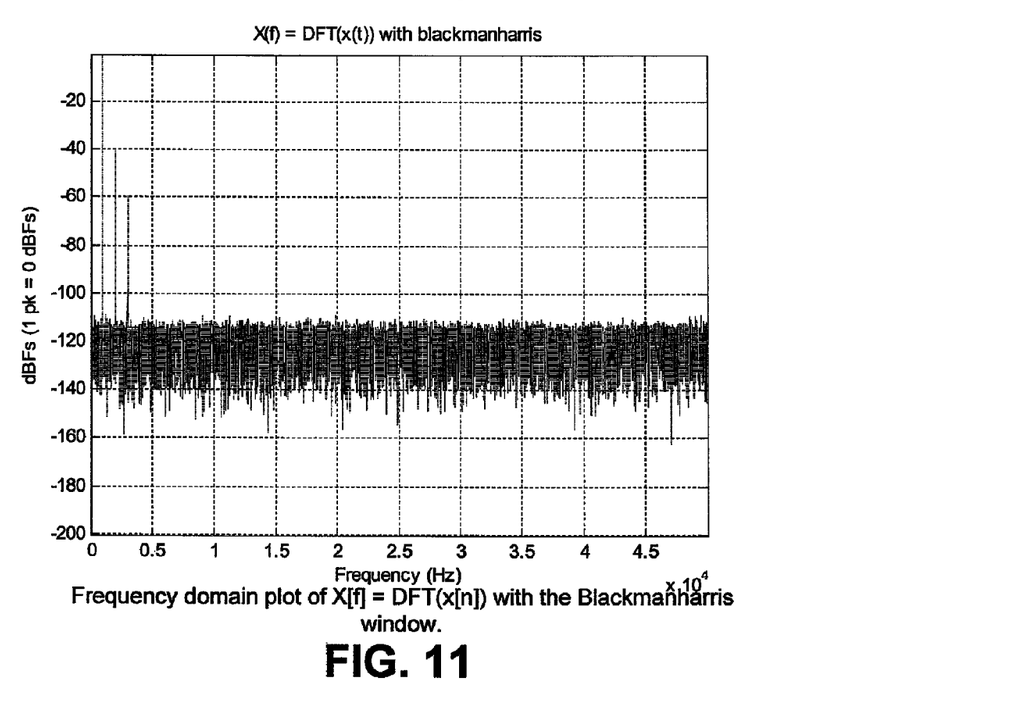
FIG. 11 is a plot of the zero-mean sample of FIG. 8 in the frequency domain, transformed via the DFT after the application of the well-known Blackmanharris window.

FIG. 11 is a plot of the zero-mean sample of FIG. 8 in the frequency domain, transformed via the DFT after the application of the well-known Blackmanharris window. The spectral leakage of the signal is significantly reduced.

Figure 12:
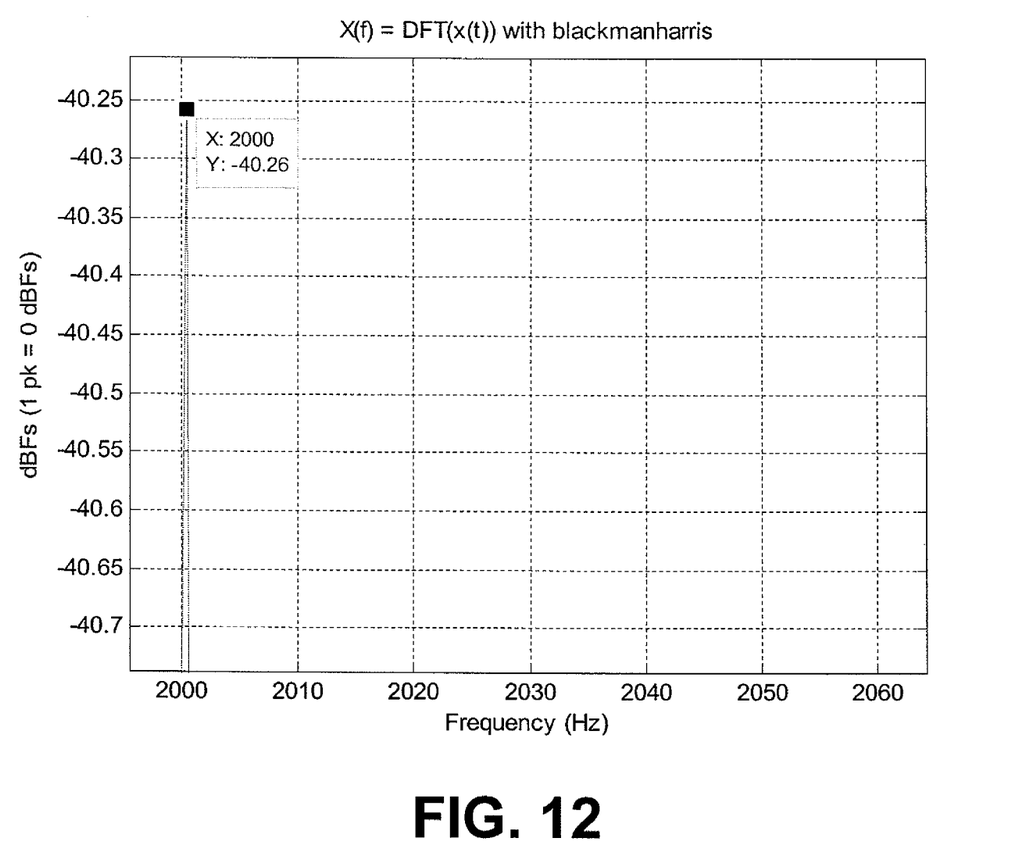
FIG. 12 is a plot showing how the amplitudes of FIG. 11 have been tainted by the windowing and frequency domain transformation.

The DC component of the signal was removed prior to the DFT. In this example, the amplitudes of the fundamental and the harmonics can be observed from the plots. However, the amplitudes have been tainted by the windowing and frequency domain transformation. This is not apparent from the figures, but by zooming into the figures, the error is noticeable. An example of this is shown in FIG. 12. As shown in FIG. 12, the amplitude of the first harmonic is reported as −40.26 dB=0.0097051, when the true amplitude is 0.01. This is an error of 2.9%. Other errors of considerable magnitude exist for the amplitudes of the fundamental and second harmonic. This increase in amplitude inaccuracy is due to windowing the time domain data and performing the DFT. The frequency components are visible; however, the amplitudes are still not accurate.

The next line of code executes the calculation of the SNR, SINAD, and THD values of the data record.

```
%----------------------------------------------
% Run algorithm. "SnrSinadThd" is an m-file
and is included in this document.
%----------------------------------------------
[snr, sinad, thd] = SnrSinadThd(x,Fs);
% Calculate errors
fprintf('SNR Error      (dB) = %1.16e \n',abs(snrA-snr))
fprintf('SINAD Error    (dB) = %1.16e \n',abs(sinadA-sinad))
fprintf('THD Error      (dB) = %1.16e \n',abs(thdA-thd))
%----------------------------------------------
```

Output of code segment above:

```
Actual SNR       (dB) = 1.1269554921315398e+002
Actual SINAD     (dB) = 7.5688413973964472e+001
Actual THD       (dB) = -3.9956786262173356e+001
Guess Frequency  (Hz) = 9.9945068359375e+002
Actual Frequency (Hz) = 9.999999994542e+002
SNR       (dB) = 1.1269607926751607e+002
SINAD     (dB) = 7.5688492903948301e+001
THD       (dB) = -3.9956920016014273e+001
SNR Error        (dB) = 5.3005436208763967e-004
SINAD Error      (dB) = 7.8929983828857075e-005
THD Error        (dB) = 1.3375384070712926e-004
```

The reason that the SNR, SINAD, and THD errors are not exactly equal to zero is because added noise contains components across all frequencies. Thus, the frequencies of the noise that were interpreted as part of the fundamental signal and harmonics were obviously 1 kHz, 2 kHz, and 3 kHz. This is shown by the following example, which does not contain any added noise.

EXAMPLE 2

This example uses MATLAB with no noise.

```
<----------------------------------------------
>
f =
    1000
DC =
   -1.221401084230035e+002
fund_amp =
    1
harm_amps =
   0.01000000000000   0.00100000000000
noise_amp =
   0
Actual SNR       (dB) = Inf
Actual SINAD     (dB) = 8.4704397798531446e+001
Actual THD       (dB) = -3.9956786262173566e+001
Guess Frequency  (Hz) = 1.0000000000000000e+003
Actual Frequency (Hz) = 9.9999999999999989e+002
RMS Noise = 1.6946109082896148e-014
RMS Noise & Distortion = 7.1063352017764134e-003
```

-continued

```
SNR     (dB) = 3.1715591162664333e+002
SINAD   (dB) = 8.4704397798530891e+001
THD     (dB) = -3.9956786262172599e+001
SNR Error     (dB) = Inf
SINAD Error   (dB) = 5.5422333389287814e-013
THD Error     (dB) = 9.6633812063373625e-013
Elapsed time is 0.24532 minutes.
<----------------------------------------
>
```

This example shows that the actual and calculated SINAD and THD values are equal since error on the order of $10^{-13}$ is deemed to be zero. However, the output shows a SNR error of infinite "Inf" because the actual SNR is infinite since there is no added noise. In this example, the calculated SNR is 317 dB. The error is due to round off error that is obtained when the system attempts to calculate possible noise. A value of the RMS Noise of 2.220446049250313e-016 is obtained when zero should be the result. Thus, the calculated SNR would become infinite, which implies that the SNR error would be zero as well.

EXAMPLE 3

This example uses MATLAB with no noise or harmonics.

```
<----------------------------------------
>
f =
      1000
DC =
   -3.05809642555034
fund_amp =
      1
noise_amp =
      0
Actual SNR     (dB) = Inf
Actual SINAD   (dB) = Inf
Actual THD     (dB) = -Inf
Guess Frequency (Hz) = 1.0000000000000000e+003
Actual Frequency (Hz) = 9.9999999999999989e+002
RMS Noise = 2.3785112952837720e-015
RMS Noise & Distortion = 2.3784698372201782e-015
SNR     (dB) = 3.0240911927933155e+002
SINAD   (dB) = 3.0240927067794127e+002
THD     (dB) = -3.1411900523455688e+002
SNR Error     (dB) = Inf
SINAD Error   (dB) = Inf
THD Error     (dB) = Inf
Elapsed time is 0.22272 minutes.
<----------------------------------------
>
```

For the same reason as in example 2, example 3 shows infinite (Inf) SNR, SINAD and THD errors. However, the same logic applies here as in example 2. The error is due to MATLAB round off errors and the data in example 3 should be interpreted as follows. Since the SNR, SINAD, and THD values are all greater than 300 dB in absolute value, they should be considered the maximum values attainable. This implies that the values for SNR, SINAD, and THD are Inf, Inf, and -Inf, respectively. This further implies that the error obtained for each value goes to zero as round off errors go to zero as well.

The foregoing detailed description has been given for understanding exemplary implementations of the invention and no unnecessary limitations should be understood therefrom as modifications will be obvious to those skilled in the art without departing from the scope of the appended claims and their equivalents.

What is claimed is:

1. A system for determining signal-to-noise ratio (SNR), signal-to-noise and distortion ratio (SINAD), and total harmonic distortion (THD) of a signal from which sampled data is obtained, the system comprising:
   means for estimating a frequency of a dominant sinusoidal signal from the sampled data;
   means for iteratively fitting a curve to the sampled data using the estimated frequency of the dominant sinusoidal signal, the curve comprising a fundamental sinusoid, harmonic components and a DC offset; and
   means for computing SNR, SINAD and THD of the signal represented by the sampled data using the fundamental sinusoid, harmonic components and a DC offset from the iteratively fitted curve.

2. The system of claim 1, wherein the means for iteratively fitting the curve to the sampled data initially assumes that the frequency of the dominant sinusoidal signal is within an initial range of values including the estimated frequency of the dominant sinusoidal signal.

3. The system of claim 2, in which the range of values is divided into discrete points.

4. The system of claim 3, in which an error value is plotted for each discrete point.

5. The system of claim 4, in which a frequency having a minimum error is selected as an updated estimate of the dominant sinusoidal frequency.

6. The system of claim 5, wherein the means for iteratively fitting the curve to the sampled data subsequently assumes that the frequency of the dominant sinusoidal signal is within an updated range of values including the updated estimated frequency of the dominant sinusoidal signal, the updated range of values being smaller than the initial range of values.

7. The system of claim 6, further comprising means for determining an amplitude and a frequency of the harmonic components.

8. The system of claim 1, wherein the means for estimating the frequency of the dominant sinusoidal signal from the sampled data, the means for iteratively fitting the curve to the sampled data, and the means for computing SNR, SINAD and THD of the signal represented by the sampled data comprise a processor and a memory configured to store software instructions to cause the processor to execute algorithms for estimating the frequency of the dominant sinusoidal signal from the sampled data, for iteratively fitting the curve to the sampled data, and for computing SNR, SINAD and THD of the signal represented by the sampled data.

9. The system of claim 1, wherein the means for iteratively fitting a curve to the sampled data stops iterating when one or more convergence criteria are satisfied.

10. The system of claim 9, wherein the convergence criteria comprises at least one of the computed SNR, the THD and the SINAD changes by less than a threshold amount from one iteration to a next iteration.

11. A method, implemented in one of a computing device and a processor, for determining signal-to-noise ratio (SNR), signal-to-noise and distortion ratio (SINAD), and total harmonic distortion (THD) of a signal from which sampled data is obtained, the method comprising:
   estimating a frequency of a dominant sinusoidal signal from the sampled data;
   iteratively fitting a curve to the sampled data using the estimated frequency of the dominant sinusoidal signal, the curve comprising a fundamental sinusoid, harmonic components and a DC offset; and computing SNR, SINAD and THD of the signal represented by the sampled data using the fundamental sinusoid, harmonic components and a DC offset from the iteratively fitted curve.

12. The method of claim 11, wherein iteratively fitting the curve to the sampled data includes initially assuming that the frequency of the dominant sinusoidal signal is within an initial range of values including the estimated frequency of the dominant sinusoidal signal.

13. The method of claim 12, further comprising dividing the range of values into discrete points.

14. The method of claim 13, further comprising plotting an error value for each discrete point.

15. The method of claim 14, further comprising selecting as an updated estimate of the dominant sinusoidal frequency a frequency having a minimum error.

16. The method of claim 15, wherein iteratively fitting the curve to the sampled data includes subsequently assuming that the frequency of the dominant sinusoidal signal is within an updated range of values including the updated estimated frequency of the dominant sinusoidal signal, the updated range of values being smaller than the initial range of values.

17. The method of claim 13, further comprising determining an amplitude and a frequency of the harmonic components.

18. The method of claim 11, wherein the signal comprises an analog signal and the method further comprising sampling the analog signal to obtain the sampled data.

19. The method of claim 11, wherein estimating the frequency of the dominant sinusoidal signal from the sampled data includes:

transforming the sampled data into a frequency domain;

finding a frequency in the frequency domain wherein the transformed sampled data has a largest amplitude; and estimating the frequency of the dominant sinusoidal signal to be the frequency in the frequency domain wherein the transformed sampled data has the largest amplitude.

20. The method of claim 11, further comprising stopping iterating when one or more convergence criteria are satisfied.

21. The method of claim 20, wherein the convergence criteria comprises at least one of the computed SNR, the THD and the SINAD changes by less than a threshold amount from one iteration to a next iteration.

* * * * *

UNITED STATES PATENT AND TRADEMARK OFFICE
CERTIFICATE OF CORRECTION

| | | |
|---|---|---|
| PATENT NO. | : 7,895,006 B2 | Page 1 of 1 |
| APPLICATION NO. | : 11/962665 | |
| DATED | : February 22, 2011 | |
| INVENTOR(S) | : Bryan David Thompson | |

It is certified that error appears in the above-identified patent and that said Letters Patent is hereby corrected as shown below:

In column 14, line 1, in Claim 17, delete "claim 13," and insert -- claim 16, --, therefor.

Signed and Sealed this
Twelfth Day of April, 2011

David J. Kappos
*Director of the United States Patent and Trademark Office*